US008446222B2

(12) United States Patent
Brenndorfer

(10) Patent No.: US 8,446,222 B2
(45) Date of Patent: May 21, 2013

(54) APPARATUS AND METHODS FOR REDUCING NOISE IN OSCILLATING SIGNALS

(75) Inventor: Knut Brenndorfer, Blaustein-Herrlingen (DE)

(73) Assignee: Sand 9, Inc., Cambridge, MA (US)

( * ) Notice: Subject to any disclaimer, the term of this patent is extended or adjusted under 35 U.S.C. 154(b) by 115 days.

(21) Appl. No.: 13/002,901

(22) PCT Filed: Jul. 6, 2009

(86) PCT No.: PCT/US2009/003954
§ 371 (c)(1),
(2), (4) Date: May 9, 2011

(87) PCT Pub. No.: WO2010/005542
PCT Pub. Date: Jan. 14, 2010

(65) Prior Publication Data
US 2011/0204936 A1 Aug. 25, 2011

(30) Foreign Application Priority Data
Jul. 8, 2008 (EP) ..................................... 08012269

(51) Int. Cl.
*H03L 7/04* (2006.01)
(52) U.S. Cl.
USPC ................... 331/16; 331/34; 331/17
(58) Field of Classification Search
USPC ............................ 331/16, 34, 185, 177 R, 17
See application file for complete search history.

(56) References Cited

U.S. PATENT DOCUMENTS

| 4,988,957 | A | * | 1/1991 | Thompson et al. ....... 331/107 A |
| 5,019,792 | A | | 5/1991 | DiBiase et al. |
| 5,414,741 | A | | 5/1995 | Johnson |
| 5,828,266 | A | | 10/1998 | Couet |
| 6,420,916 | B1 | * | 7/2002 | Freeman ....................... 327/156 |
| 7,459,946 | B2 | | 12/2008 | Bollenbeck et al. |
| 2007/0109061 | A1 | | 5/2007 | Rohde et al. |
| 2007/0297553 | A1 | | 12/2007 | Sutioso et al. |
| 2008/0136473 | A1 | | 6/2008 | Bollenbeck et al. |

FOREIGN PATENT DOCUMENTS

| DE | 102005024624 B3 | 11/2006 |
| DE | 102006052873 A1 | 5/2008 |

OTHER PUBLICATIONS

International Search Report and Written Opinion from International Application No. PCT/US2009/003954.
Office Action dated Aug. 3, 2010 and extended European Search Report and Opinion dated Oct. 8, 2008 for European Patent Application No. 08012269.
Notice of Opposition from corresponding European Application No. 08012269.0, mailed Feb. 8, 2012.

(Continued)

*Primary Examiner* — Arnold Kinkead
(74) *Attorney, Agent, or Firm* — Wolf, Greenfield & Sacks, P.C.

(57) ABSTRACT

Methods and apparatus are described for reducing noise, such as phase noise, in an oscillating signal. The oscillating signal may be generated by a signal generator having a mechanical resonator, such as a crystal oscillator. A filter may be coupled to the output of the mechanical resonator and may have its center frequency adjusted using a phase-locked loop (PLL). A feedback signal from the filter to the signal generator may also be used.

9 Claims, 2 Drawing Sheets

OTHER PUBLICATIONS

Shoval, A., "Analog Adaptive Filtering Techniques for High-Speed Data Communication", University of Toronto, Doctor Thesis, Toronto, Ontario, Canada, 1995.

Rao, K. R., et al., "A novel 'follow the master' filter", Proceedings of the IEEE, vol. 65, No. 12, pp. 1725-1726, 1977.

Kozma, K. A., et al., "Automatic tunning of continuous-time integrated filters using an adaptive filter technique", IEEE Transactions on Circuits and Systems, vol. 38, No. 11, 1991, pp. 1241-1248.

Tsividis, Y. P., et al., "Integrated Continuous-Time Filters", Chapter 6: "More about Automatic Tuing and Adaptivity", IEEE, New York, 1993, pp. 389-391.

Tsividis, Y. P., "Self-Tuned Filters", El. Letters, vol. 17, No. 12, 1981, pp. 406-407.

Moulding, K., et al., "Gyrator Video Filter IC with automatic tuning", IEEE J. Solid-State Circuits, vol. SC-15, No. 6, 1980, pp. 963-968.

* cited by examiner

__US 8,446,222 B2__

APPARATUS AND METHODS FOR REDUCING NOISE IN OSCILLATING SIGNALS

RELATED APPLICATIONS

This application is a U.S. National Stage patent application based on International Application PCT/US2009/003954 filed Jul. 6, 2009, and entitled APPARATUS AND METHODS FOR REDUCING NOISE IN OSCILLATING SIGNALS, which claims priority to European Patent Application 08012269.0 filed Jul. 8, 2008, and entitled Oscillator Phase Noise Reduction By Self Tuning Filter and Noise Feedback, both of which are incorporated herein by reference in their entireties.

BACKGROUND

1. Field

The technology described herein relates to apparatus and methods for reducing noise in oscillating signals.

2. Related Art

Today's high speed communication systems and RADAR systems require signal sources with low phase noise, which themselves need low phase noise reference signals. Today's low noise reference signal generators are usually based on Quartz crystals, surface acoustic wave (SAW), microelectromechanical systems (MEMS), nanoelectromechanical systems (NEMS), bulk acoustic wave (BAW), or FBAR resonators, and the minimum phase noise of the resulting reference signal that can be achieved is constrained by the quality factor of the resonator, the power handling capabilities of the resonator, and by the noise generated in the oscillator circuitry of the reference signal generator coupled to the resonator (i.e., noise due to the currents in the oscillator circuitry).

SUMMARY

According to one aspect of the technology, a device is provided, comprising a signal generator comprising a mechanical resonator and configured to produce an oscillating signal. The device further comprises a filter comprising a series-resonant crystal, the filter having an input configured to receive the oscillating signal and an output configured to produce a filtered signal. The device further comprises a phase locked loop (PLL) having a first input configured to receive the oscillating signal and a second input configured to receive the filtered signal, and having an output configured to provide a control signal to the filter to tune the filter.

According to another aspect, a method is provided, comprising generating an oscillating signal using a mechanical resonator, filtering the oscillating signal with a filter to produce a filtered signal that is approximately zero degrees or approximately 180 degrees out-of-phase with the oscillating signal, and comparing a phase of the oscillating signal to a phase of the filtered signal using a phase-locked loop (PLL). The method further comprises generating a tuning control signal with the PLL to adjust a filtering frequency of the filter.

BRIEF DESCRIPTION OF DRAWINGS

Various embodiments of the technology will be described with respect to the following figures. It should be appreciated that the figures are not intended to be drawn to scale. In the drawings, each identical or nearly identical component that is illustrated in various figures is represented by a like numeral. For purposes of clarity, not every component may be labeled in every drawing.

DETAILED DESCRIPTION

Methods and apparatus for reducing noise in oscillating signals are described. Some embodiments reduce noise in oscillating signals generated using a mechanical resonator, such as a Quartz crystal, SAW, MEMS, NEMS, BAW, or FBAR resonator.

The phase noise associated with an oscillating signal (e.g., output by an oscillator using a mechanical resonator) may cover a spectrum of frequencies, with some of the noise occurring at a frequency close to the predominant frequency of the oscillating signal, and some of the noise occurring at frequencies farther from the predominant frequency of the oscillating signal. According to some aspects of the technology, different techniques may be used to reduce these different types of noise.

Filters employing a mechanical resonator of the same type as a mechanical resonator of a signal generator producing an oscillating signal may be used to filter the oscillating signal. However, even though the resonator of the signal generator and the resonator of the filter may be of the same type, theoretically allowing for the center frequency of the filter to be aligned with the operating frequency of the signal generator, they are still distinct resonators, and may age differently, experience different thermally-induced changes in operation, and otherwise differ in their operation. Thus, the center frequency of the filter may not be consistently maintained at the operating frequency of the signal generator.

According to one aspect of the technology, the phase noise of an oscillating output signal of a signal generator (e.g., a signal generator using a mechanical resonator to generate an oscillating signal, such as a Quartz crystal oscillator) occurring at frequencies relatively far from the operating frequency of the signal generator is reduced by filtering the oscillating output signal with a filter that produces a filtered signal that is 0 degrees or 180 degrees out-of-phase with the oscillating output signal. The center frequency of the filter may be tuned to be equal to, or substantially equal to, the frequency of the oscillating output signal produced by the signal generator, and to follow variations in the frequency of the oscillating output signal. According to another aspect of the technology, phase noise occurring at frequencies relatively close to the operating frequency of the signal generator is reduced using the above-described technique in combination with providing the filtered signal to the signal generator as a feedback signal.

Figure 1:
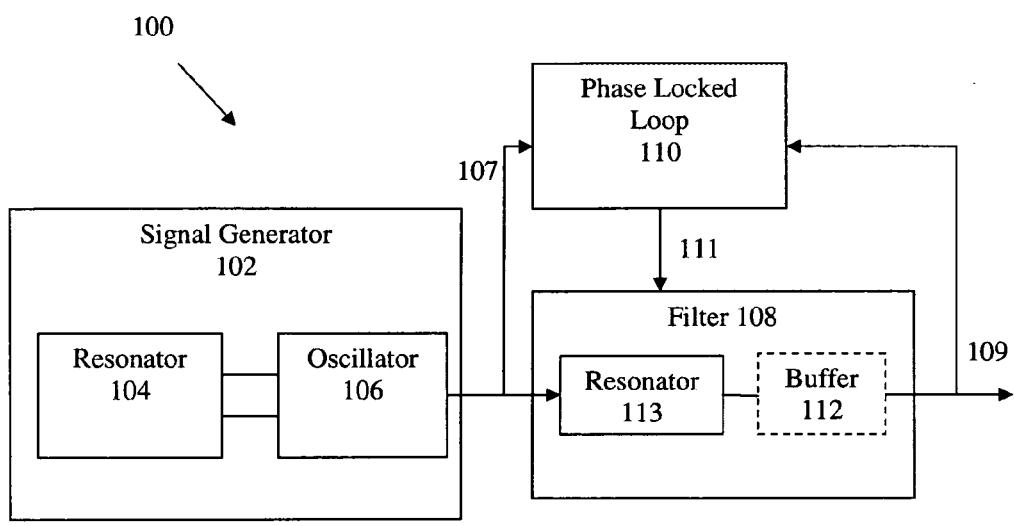
FIG. 1 is a schematic diagram of an electromechanical circuit comprising a signal generator having a mechanical resonator and oscillator circuitry, a filter comprising a resonator and an optional buffer, and a phase locked loop (PLL) coupled to the filter, according to one non-limiting embodiment.

FIG. 1 illustrates a non-limiting example of a device which may be used to reduce noise (e.g., phase noise) in an oscillating signal occurring at frequencies relatively far from the oscillating signal frequency. As shown, the device 100 comprises a signal generator 102, which itself may include a resonator 104 coupled to an oscillator 106. The signal generator 102 produces a signal 107 (which may be an oscillating signal), and is coupled to provide the signal 107 to a filter 108, which itself is coupled to a phase-locked loop (PLL) 110. The filter 108, which is a bandpass filter in some embodiments, and which includes a resonator 113 and an optional buffer 112, provides a filtered signal 109 to the PLL 110. The PLL 110 is also configured to receive the signal 107 from the signal generator 102, and to provide a tuning control signal 111 to the filter 108 to tune the filter 108.

As mentioned, the signal generator may generate a signal 107, which may be an oscillating signal. The signal generator may take any suitable form, and may include a resonator 104 coupled to an oscillator 106, as shown. The resonator 104 may be a mechanical resonator, and may be any of a Quartz crystal, SAW, MEMS, NEMS, BAW, or FBAR resonator, or other type of mechanical resonator. The resonator 104 may be coupled to oscillator 106, which may be any suitable circuitry configured to drive, or otherwise control, the resonator 104. It should be appreciated that the combination of the resonator 104 and oscillator 106 may itself be referred to simply as an "oscillator." It should also be appreciated that while the signal 107 output by the signal generator is illustrated as coming from the oscillator 106, it could alternatively be taken directly from the resonator 104, or from any other suitable part of the signal generator 102.

The filter 108, which is coupled to the signal generator 102 to receive the signal 107 output by the signal generator 102, may comprise a resonator 113. In some embodiments, the resonator 113 is a mechanical resonator of the same or similar type as the resonator 104. For example, if the resonator 104 is a Quartz crystal, the resonator 113 may be a Quartz crystal. Thus, in some embodiments, the resonator 113 of the filter has a center frequency equal to, or approximately equal to, the center operating frequency of the resonator 104.

In some embodiments, the filter 108 is configured to produce an output signal (e.g., filtered signal 109) that is either approximately (which includes exactly) zero degrees or approximately 180 degrees out-of-phase with its input signal (e.g., signal 107). Such a phase relationship between the input signal and output signal of the filter is achieved, in some non-limiting embodiments, by using a series-resonant crystal for the resonator 113. In some embodiments, including some of those in which the filter output signal is approximately zero degrees or approximately 180 degrees phase-shifted relative to the filter input signal, the filter 108 has a very narrow pass band, which may be achieved, for example, by using a resonator 113 with a high Q.

As mentioned, in some embodiments, the output signal 109 of the filter 108 may be approximately zero degrees or approximately 180 degrees phase-shifted from the signal 107. According to one non-limiting embodiment, a phase difference of approximately zero degrees between signals 107 and 109 may be achieved by using a series-resonant crystal for resonator 113, and by excluding the optional buffer 112, i.e., by taking signal 109 directly from resonator 113. According to one non-limiting embodiment, a phase difference of approximately 180 degrees between signals 107 and 109 may be achieved by using a series-resonant crystal for resonator 113 and by using a buffer 112 which induces a phase shift of approximately 180 degrees. The buffer 112 may also optionally introduce a gain to the signal from the resonator 113.

The filter 108 may be tunable, for example including a tuning element. Thus, for example, in those embodiments in which the filter is a bandpass filter, the center frequency of the filter may be tuned. The tuning element may tune the mechanical resonator of the filter, or otherwise tune the filter. The filter 108 may be tuned using the PLL 110, which may be a digital or analog PLL. The PLL 110 may receive the signal 107 from the signal generator 102 and the filtered signal 109 (which, again, in some embodiments is approximately (which includes exactly) zero degrees or 180 degrees out-of-phase with the signal 107) as inputs, may determine if there is a phase difference between signal 107 and filtered signal 109, and may generate the tuning control signal 111, which is a tuning voltage in some embodiments, based on any phase difference between the signals 107 and 109. In this manner, a substantially constant phase difference (e.g., of approximately (which, again, includes exactly) zero degrees or 180 degrees) may be maintained between the filter input and output signals, and the center frequency of the filter may be tuned to substantially correspond to the center operating frequency of the signal generator. In the configuration of FIG. 1, the filter 108 may be considered a "self-tuning" filter in that its center frequency may be tuned by the PLL based on the input signal to and output signal of the filter.

In some embodiments, the configuration of FIG. 1 may ensure that the center frequency of the filter 108 tracks variations in the operating frequency of the signal generator 102, irrespective of whether the center frequency of the filter 108 corresponds identically to the operating frequency of the signal generator 102. By tracking variations in the frequency of the signal generator 102, the filter may function appropriately to reduce phase noise of the signal 107 despite differences in aging between the resonator 113 of the filter and the resonator 104 of the signal generator, temperature induced differences between the two, manufacturing differences between the two, etc.

The configuration of device 100 may allow for the PLL to have a simple design, such that it may lack additional components (e.g., mixers, etc.) which may be susceptible to temperature-induced variations, age-induced variations, etc. Thus, by not including such additional components in the device 100, the center frequency of the filter may be more accurately tuned to the frequency output by the signal generator. As mentioned, the PLL may be a digital PLL in some embodiments.

As mentioned, in some embodiments the filter 108 is a bandpass filter, and therefore has a corresponding pass bandwidth, i.e., a bandwidth of frequencies which the filter passes (also referred to herein as the passband). The configuration of device 100, in which the filter is coupled to the PLL as shown, may reduce noise in the signal 107 outside the pass bandwidth of the filter, which may be referred to as "far-out noise" in this application. Since the center frequency of the filter 108 may be tuned to be equal to, or approximately equal to, the operating frequency of the signal generator, the far-out noise may therefore correspond to phase noise occurring at frequencies relatively far from the operating frequency of the signal generator.

Figure 2:
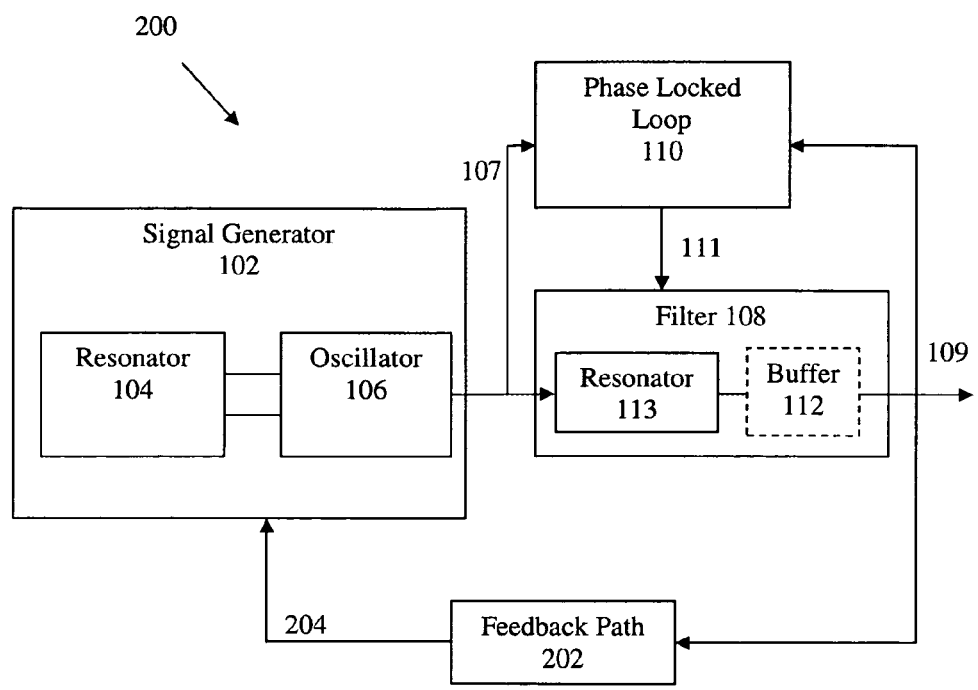
FIG. 2 is a schematic diagram of the electromechanical circuit of FIG. 1, further comprising a feedback path between the filter and the signal generator.

In some embodiments, it may be desirable to also reduce noise in the signal 107 within the pass bandwidth of the filter 108, which may be referred to herein as "close-in noise." One aspect of the present technology additionally reduces such close-in noise by providing a feedback path between the output of the filter and the signal generator. FIG. 2 illustrates an example.

As shown in FIG. 2, the device 200 is substantially the same as the device 100, but further includes feedback path 202, which provides a feedback signal 204 to the signal generator 102. In FIG. 2, as in FIG. 1, the buffer 112 is optional, such that the signal 109 may be approximately 0 degrees or approximately 180 degrees shifted relative to signal 107. Because, in some embodiments, the filtered signal 109 may be 180 degrees out-of-phase with the signal 107, the feedback signal 204 may also be 180 degrees-out-phase with the signal 107. In some embodiments, the feedback signal 204 may be the filtered signal 109, i.e., the feedback path 202 may not alter the filtered signal 109. The feedback signal may be provided directly to the resonator 104, to the oscillator 106 in some embodiments, or to any other suitable part of the signal generator 102. It may serve to reduce noise in the signal 107 across substantially all frequencies of the signal 107, including close-in phase noise, i.e., phase noise occurring at frequencies within the pass bandwidth of the filter 108. Thus, the device 200 may reduce both close-in and far-out phase noise. In some embodiments, the signal provided to the feedback path 202 may be from either the resonator 113 or the buffer 112, and the signal provided to the PLL 110 may be from the other of the resonator 113 and the buffer 112.

In some embodiments, the filter 108 may impose a delay on the signal 107, such that the filtered signal 109, and the feedback signal 204 (which, again, in some embodiments may be the same), are delayed relative to the signal 107. In some embodiments, it may be desirable to use a filter 108 creating a substantial time delay between its input and output signals, which may result in a steep phase change versus frequency.

As explained above, the methods and apparatus described herein may be used to reduce the phase noise of a signal, for example of a signal generated by a mechanical resonator. Such methods and apparatus may also reduce spurious signals. The spurious signals may be caused by exciting two or more different resonances or modes in the mechanical resonator of the signal generator, by modulation of the signal output by the signal generator, or in any other manner, and may be undesirable in some embodiments. Therefore, one or more of the methods and apparatus described herein may be used to reduce the spurious signals.

Having thus described several aspects of at least one embodiment of the technology, it is to be appreciated various alterations, modifications, and improvements will readily occur to those skilled in the art. Such alterations, modifications, and improvements are intended to be within the spirit and scope of the technology described herein. Accordingly, the foregoing description and drawings are by way of example only.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A device, comprising:
   a signal generator comprising a mechanical resonator and configured to produce an oscillating signal;
   a filter comprising a series-resonant crystal, the filter having an input configured to receive the oscillating signal and an output configured to produce a filtered signal;
   a phase locked loop (PLL) having a first input configured to receive the oscillating signal and a second input configured to receive the filtered signal, and having an output configured to provide a control signal to the filter to tune the filter; and
   a feedback path from the output of the filter to an input of the signal generator.

2. The device of claim 1, wherein the PLL is a digital PLL.

3. The device of claim 2, wherein the PLL does not include a frequency mixer.

4. The device of claim 1, wherein the signal generator further comprises oscillator circuitry coupled to the mechanical resonator to drive the mechanical resonator.

5. The device of claim 1, wherein the PLL is configured to generate the control signal to tune the filter to maintain a phase difference of approximately 180 degrees between the oscillating signal and the filtered signal.

6. A method, comprising:
   generating an oscillating signal using a mechanical resonator;
   filtering the oscillating signal with a filter to produce a filtered signal that is approximately zero degrees or approximately 180 degrees out-of-phase with the oscillating signal;
   comparing a phase of the oscillating signal to a phase of the filtered signal using a phase-locked loop (PLL);
   generating a tuning control signal with the PLL to adjust a filtering frequency of the filter; and
   providing the filtered signal to the mechanical resonator as a feedback signal.

7. The method of claim 6, wherein generating a tuning control signal comprises generating a tuning control signal to maintain a phase difference of approximately 180 degrees between the oscillating signal and the filtered signal.

8. The method of claim 6, wherein the filter is a bandpass filter, and wherein generating a tuning control signal with the PLL to adjust a filtering frequency of the filter comprises generating a tuning control signal to adjust a center frequency of the filter.

9. The method of claim 6, wherein the PLL is a digital PLL.

* * * * *